(12) United States Patent
Ok et al.

(10) Patent No.: US 9,595,592 B1
(45) Date of Patent: Mar. 14, 2017

(54) FORMING DUAL CONTACT SILICIDE USING METAL MULTI-LAYER AND ION BEAM MIXING

(71) Applicant: International Business Machines Corporation, Armonk, NY (US)

(72) Inventors: Injo Ok, Loudonville, NY (US); Balasubramanian Pranatharthiharan, Watervliet, NY (US); Soon-Cheon Seo, Glenmont, NY (US); Charan Veera Venkata Satya Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/983,653

(22) Filed: Dec. 30, 2015

(51) Int. Cl.

| H01L 21/425 | (2006.01) |
|---|---|
| H01L 29/45 | (2006.01) |
| H01L 21/8238 | (2006.01) |
| H01L 21/768 | (2006.01) |
| H01L 23/528 | (2006.01) |
| H01L 23/532 | (2006.01) |
| H01L 27/092 | (2006.01) |

(52) U.S. Cl.
CPC ........ *H01L 29/45* (2013.01); *H01L 21/76804* (2013.01); *H01L 21/76865* (2013.01); *H01L 21/76883* (2013.01); *H01L 21/823871* (2013.01); *H01L 23/5283* (2013.01); *H01L 23/53209* (2013.01); *H01L 23/53295* (2013.01); *H01L 27/092* (2013.01)

(58) Field of Classification Search
CPC ............................................... H01L 21/28518
USPC .............................. 257/55, 69; 438/528, 659
See application file for complete search history.

(56) References Cited

U.S. PATENT DOCUMENTS

| 5,470,794 A | 11/1995 | Anjum et al. |
|---|---|---|
| 6,750,124 B1 | 6/2004 | Mitan et al. |
| 7,115,511 B2 | 10/2006 | Hautala |
| 7,861,406 B2 | 1/2011 | Lodha et al. |

(Continued)

OTHER PUBLICATIONS

Chen, P.C., et al., "Ion Beam Induced Mixing for Via Contact in MCP Module", Nov. 1, 1989, pp. 1-2.

(Continued)

*Primary Examiner* — Dung Le
(74) *Attorney, Agent, or Firm* — Fleit Gibbons Gutman Bongini Bianco PL; Thomas S. Grzesik

(57) ABSTRACT

A method for forming contact silicide for a semiconductor structure. In one embodiment, a dielectric layer is formed over a p-type region of a semiconductor structure comprising a gate stack and source and drain regions. The source and drain regions are formed within a semiconductor layer. First and second contact trenches are formed within the dielectric layer exposing at least a portion of the source region and a portion of the drain region, respectively. First and second metal layers are formed within the first and second contact trenches. The second metal layer includes a metallic material that is different from a metallic material of the first meal layer. The metallic materials of the first and second metal layers in a lower region of the first and second contact trenches are intermixed. A silicide is formed within the source and drain regions from the semiconductor layer and the intermixed metallic materials.

16 Claims, 11 Drawing Sheets

(56) References Cited

U.S. PATENT DOCUMENTS

| | | | |
|---|---|---|---|
| 8,598,024 B2 | 12/2013 | Kim et al. | |
| 8,709,944 B2 | 4/2014 | Russell et al. | |
| 9,006,104 B2 | 4/2015 | Sargunas | |
| 9,196,694 B2* | 11/2015 | Bouche | H01L 29/41725 |
| 2008/0237603 A1* | 10/2008 | Lodha | H01L 21/26506 |
| | | | 257/69 |
| 2012/0083089 A1* | 4/2012 | Kim | H01L 21/28506 |
| | | | 438/301 |
| 2014/0225198 A1* | 8/2014 | Suk | H01L 21/82387 |
| | | | 257/369 |
| 2015/0091093 A1* | 4/2015 | Bouche | H01L 29/41725 |
| | | | 257/369 |
| 2015/0206881 A1* | 7/2015 | Tsai | H01L 27/0922 |
| | | | 257/369 |
| 2015/0332927 A1 | 11/2015 | Gluschenkov et al. | |
| 2015/0376791 A1 | 12/2015 | Gluschenkov et al. | |

OTHER PUBLICATIONS

Campbell, D.R., et al., "Formation of a Transition Metal Schottky Diode by Ion Beam Mixing" May 1, 1981, pp. 1-2.

Chao, H.H., et al. "Versatile Technique for Contact Metallurgy by Using Ion Beam Mixing Induced Silicides", Jun. 1, 1981, pp. 1-2.

Ku, Y.H., et al., "The Application of Ion-Beam Mixing, Doped Silicide, and Rapid Thermal Processing to Self-Aligned Silicide Technology", Journal of the Electrochemical Society, May 1989 pp. 1-5, vol. 137, Issue 2.

U.S. Appl. No. 14/937,968, filed Nov. 11, 2015.

* cited by examiner

FORMING DUAL CONTACT SILICIDE USING METAL MULTI-LAYER AND ION BEAM MIXING

BACKGROUND OF THE INVENTION

The present disclosure generally relates to the field of semiconductors, and more particularly relates to forming contact silicide on semiconductor structures.

With many conventional silicide formation techniques there is a high thermal budget requirement for drive-in of top metal toward the interface where silicide and silicon (or silicon germanium) meet. This can cause device degradation or silicide encroachment. Therefore, many of these conventional techniques perform a selective etch of the top metal (stop on bottom metal). However, this fabrication method limits the use of materials to form the silicide.

SUMMARY OF THE INVENTION

In one embodiment, a method for forming contact silicide for forming a semiconductor structure is disclosed. The method comprises forming a dielectric layer over a p-type region of a semiconductor structure comprising a gate stack and source and drain regions. The source and drain regions are formed within a semiconductor layer. A first contact trench and a second contact trench are formed within the dielectric layer exposing at least a portion of the source region and a portion of the drain region, respectively. A first metal layer is formed within the first and second contact trenches. A second metal layer is formed in contact with the first metal layer. The second metal layer comprises a metallic material that is different from a metallic material of the first meal layer. The metallic materials of the first and second metal layers in a lower region of the first and second contact trenches are intermixed. A silicide is formed within the source and drain regions from the semiconductor layer and the intermixed metallic materials.

In another embodiment, a semiconductor structure is disclosed. The semiconductor structure comprises a substrate and a semiconductor layer formed on the substrate. A gate stack, source, and drain regions are formed on a portion of the semiconductor layer in a p-type region of the semiconductor structure. A first contact trench and a second contact trench is formed over the source and drain regions, respectively. Each of the first and second contact trenches comprises a first metal layer and a second metal layer in contact with the first metal layer. The first metal layer comprises a metallic material that is different from a metallic material of the second meal layer. The metallic materials of the first and second metal layers are intermixed at an interface between the first metal layer and the source and drain regions, respectively. A silicide is formed within each of the source and drain regions. The silicide comprises material from the semiconductor layer and the intermixed metallic materials.

In yet another embodiment, an integrated circuit is disclosed. The integrated circuit comprises a semiconductor structure. The semiconductor structure comprises a substrate and a semiconductor layer formed on the substrate. A gate stack, source, and drain regions are formed on a portion of the semiconductor layer in a p-type region of the semiconductor structure. A first contact trench and a second contact trench is formed over the source and drain regions, respectively. Each of the first and second contact trenches comprises a first metal layer and a second metal layer in contact with the first metal layer. The first metal layer comprises a metallic material that is different from a metallic material of the second meal layer. The metallic materials of the first and second metal layers are intermixed at an interface between the first metal layer and the source and drain regions, respectively. A silicide is formed within each of the source and drain regions. The silicide comprises material from the semiconductor layer and the intermixed metallic materials.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
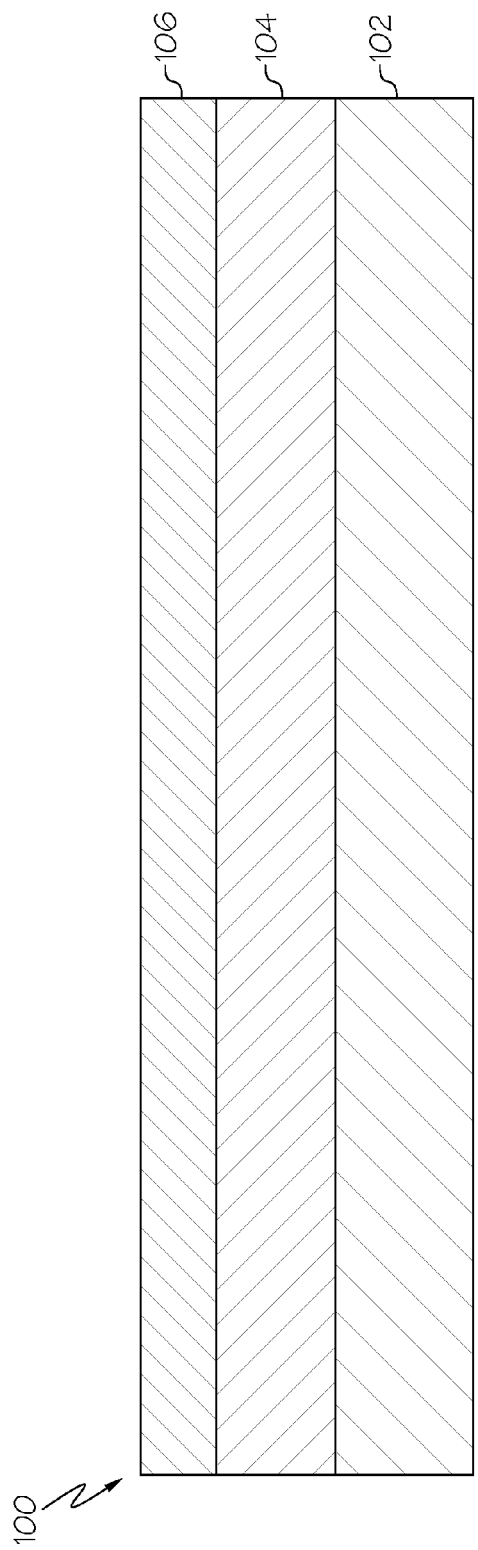
FIG. 1 is a cross-sectional view of a partial semiconductor structure according one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-11 illustrate various processes for fabricating a semiconductor device with dual contact silicide using metal multi-layer and ion beam mixing. It should be noted that the following process for forming the initial semiconductor structure (e.g., active areas, gate stack, gate spacer, source/drain regions, etc.) is only illustrative. Any process for forming these structures is applicable to embodiments of the present disclosure. As shown in FIG. 1, there is provided a partially fabricated structure 100 comprising a handle substrate 102, a buried insulator layer (e.g., buried oxide (BOX)) 104, and a semiconductor layer 106. The handle substrate 102 can be a semiconductor substrate comprising a single crystalline semiconductor material such as single crystalline silicon, a polycrystalline semiconductor material, an amorphous semiconductor material, or a stack thereof. The thickness of the handle substrate 102 can be, for example, from 10 microns to 1,000 microns, although lesser and greater thicknesses can also be employed. A buried insulator layer 104 includes a dielectric material such as silicon oxide, silicon nitride, silicon oxynitride, or any combination thereof.

In one embodiment, the semiconductor layer 106 is an extremely thin silicon-on- insulator (ETSOI) layer 106. This layer 106 can have a thickness ranging from 1 nm to 20 nm, and in one embodiment, has a thickness ranging from 3 nm to 10 nm. Alternatively, the process can begin with a "thick" SOI wafer having a thickness in the 30-90 nm range, and thinning can be performed using oxidation and a hydrofluoric acid (HF) wet etch to reduce the thickness (e.g., down to the 3-10 nm range). The semiconductor layer 106 can comprise any semiconducting material, including but not limited to Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Figure 2:
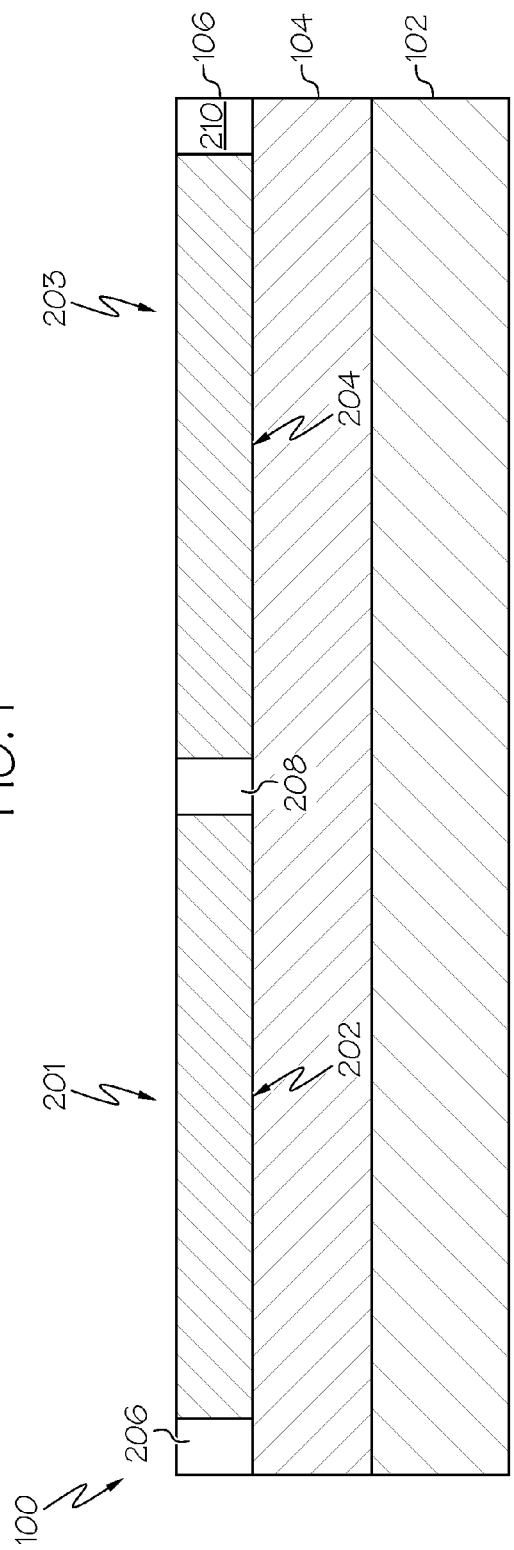
FIG. 2 is a cross-sectional view of the semiconductor structure after active areas have been defined according one embodiment of the present disclosure.

FIG. 2 shows that an active area 202, 204 within an n-FET region 201 and a p-FET region 203 of the structure 100 are then defined within the semiconductor layer 106 through pad-film deposition, patterning (e.g., by photolithography), and reactive-ion etching (RIE). For example, a pad oxide having a thickness of 2 nm to 10 nm is formed in an oxidation furnace, and a pad nitride is deposited over the pad oxide using low-pressure chemical vapor deposition (LPCVD) or rapid-thermal chemical vapor deposition (RTCVD). Photolithography and a nitride-oxide-silicon RIE are then performed to define the active areas.

Next, the active areas are isolated, such as through shallow trench isolation (STI), Local Oxidation Of Silicon for Isolation (LOCOS), or mesa isolation. In this embodiment, STI is obtained through deposition of an STI oxide, densification anneals, and chemical-mechanical polishing (CMP) that stops on the pad nitride. This forms STI regions 206, 208, 210 above the BOX layer 104 that are continuous around the active areas, as shown in FIG. 2. The pad nitride, along with any STI oxide remaining on the pad nitride, and the pad oxide are then removed (e.g., through wet etching using hot phosphoric acid and HF).

Figure 3:
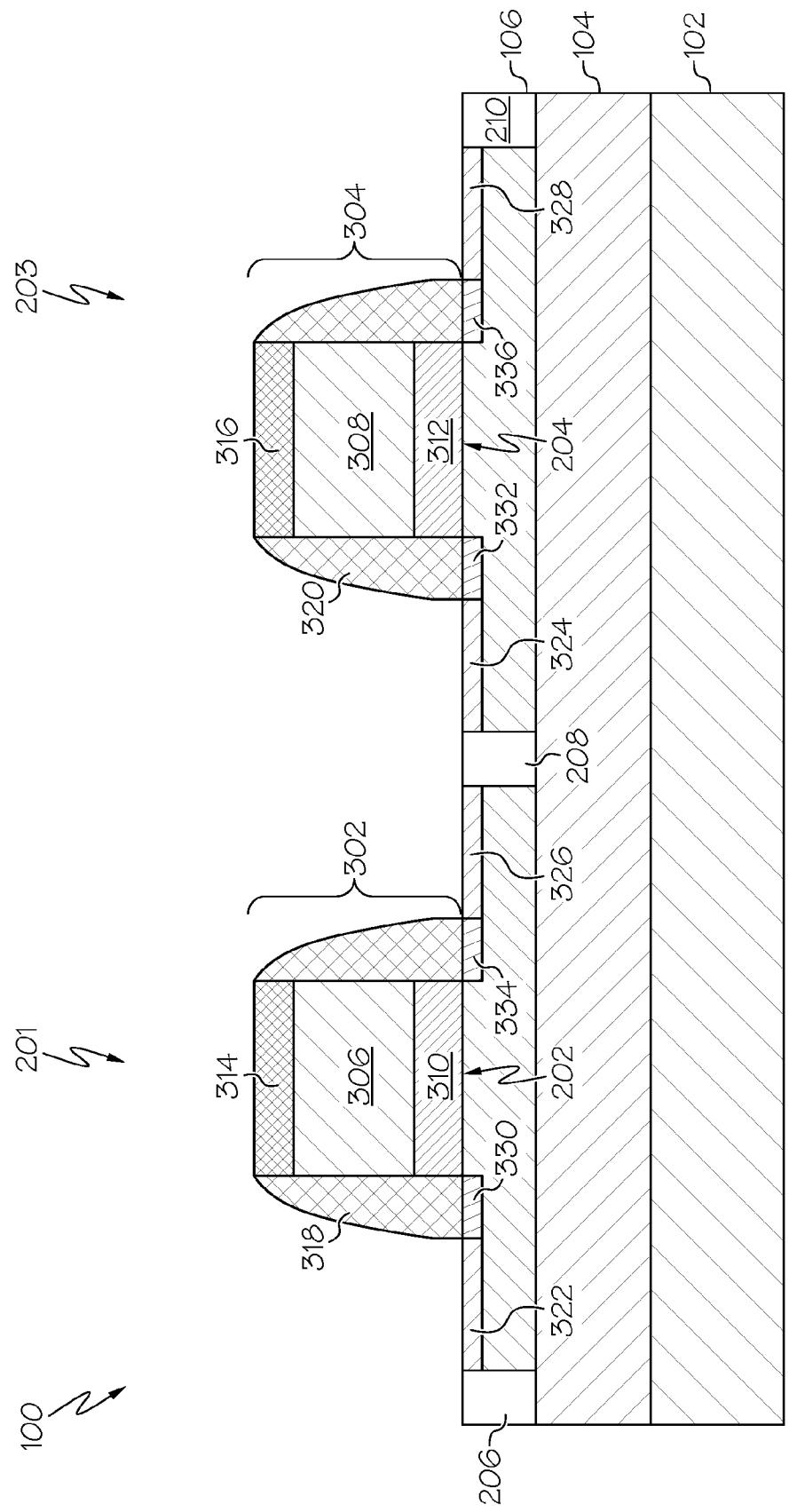
FIG. 3 is a cross-sectional view of the semiconductor structure gates stacks, spacers, source/drain regions, and source/drain extensions have been formed within n-FET and p-FET regions of the structure according one embodiment of the present disclosure.

A gate stack 302, 304 is then formed over each of the active areas 202, 204, as shown in FIG. 3. Each gate stack 302, 304 comprises a gate electrode 306, 308 over a gate dielectric 310, 312. An optional cap 314, 316 can be formed on the gate electrode 306, 308. By way of example only, the gate electrode 306, 308 can be formed from polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The gate dielectric 310, 312 can be formed from, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum or aluminum. It is notable that the configuration of the gate stacks 302, 304 depicted in the figures is merely one example. By way of example only, gate stack configurations without a gate dielectric 310, 312 are possible.

The gate stacks 302, 304 can be formed by forming/depositing the gate stack materials (e.g., the gate electrode material 306, 308, the gate dielectric 310, 312, cap 314, 316, etc.) on the structure shown in FIG. 3 and then patterning the materials into the individual gate stacks. A hardmask (not shown) is used during the patterning. This gate stack hardmask can be left in place to protect the gate stacks during subsequent processing operations. It should be noted that other process for forming the gate stack such as a replacement metal gate (RMG) process can also be used. As shown in FIG. 3, spacers 318, 320 are present and formed on opposite sides of each of the gate stacks 302, 304. The spacers 318, 320 can be formed by depositing a suitable spacer material, such as silicon nitride, onto the structure and then patterning the spacer material into the individual spacers 318, 320 shown.

Source regions 322, 324, drain regions 326, 328, source extension regions 330, 332, and drain extensions regions 334, 336 are formed within the semiconductor layer 106 in each of the n-FET and p-FET regions 201, 203. In one embodiment, these semiconductor portions are formed by introducing electrical dopants such as boron (B), gallium (Ga), indium (In), phosphorous (P), arsenic (As), and/or antimony (Sb) by ion implantation, plasma doping, and/or gas phase doping employing various masking structures as known in the art. In one embodiment, a thermal anneal can be performed to activate and diffuse the implanted ions so as to form the source regions 322, 324, drain regions 326, 328, source extension regions 330, 332, and drain extensions regions 334, 336, such as through a spike rapid-thermal anneal (RTA). The source and drain regions 322, 324, 326, 328 are interconnected by a channel. The gate stacks 302, 30466 are located over the channel and regulates electron flow through the channel.

Although shown formed within the semiconductor layer 106, the source/drain regions 322, 324, 326, 328 can be source/drain regions formed by epitaxially growing a material such as SiGe up from the semiconductor layer 310. The source and drain regions 322, 324, 326, 328 of the devices can be formed (on opposite sides of the gate stacks 302, 304) in-situ or ex-situ (e.g., by way of an ion implantation process) followed by an activation anneal of the dopants. With an in-situ process, dopants can be introduced during the growth of an epitaxial material in the source and drain regions 322, 324, 326, 328 of the devices. According to an exemplary embodiment, the source and drain regions of the PFET device(s) are formed from in-situ boron doped (ISBD) silicon germanium (SiGe). Namely, boron is introduced during growth of a SiGe epitaxial material in the source and drain regions of the PFET device(s).

The source and drain doping may be carried out by first masking the PFET device(s) (or alternatively the NFET device(s)) and forming the source and drain regions in the NFET device(s) (or alternatively the PFET device(s)). The mask is then removed and the process is repeated for the opposite polarity device, again using selective masking. The mask used during this process can be a hardmask formed from a suitable hardmask material, such as silicon nitride that is deposited onto the wafer and then patterned into the selective hardmask using standard lithography and etching techniques.

Figure 4:
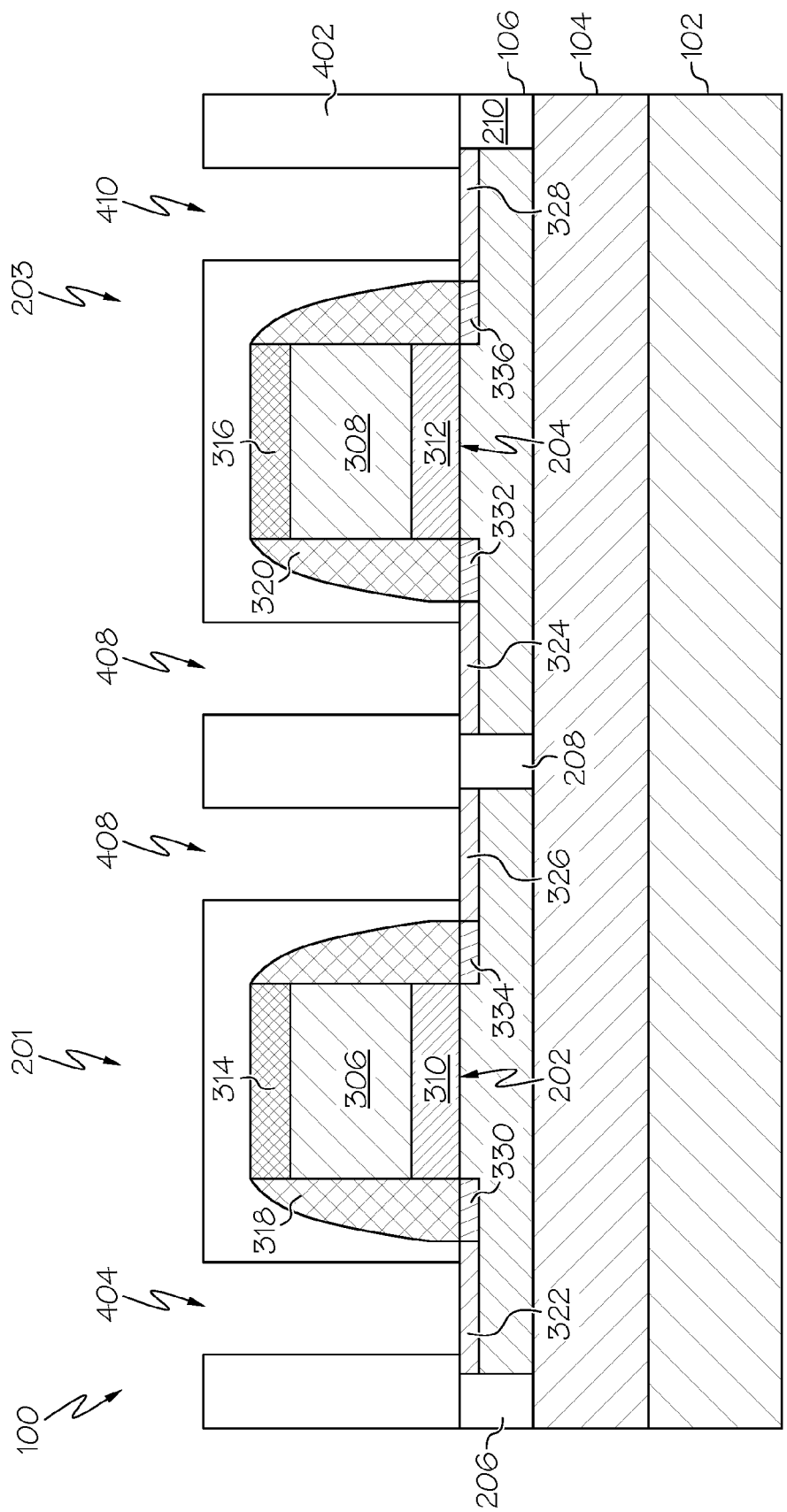
FIG. 4 is a cross-sectional view of the semiconductor structure after dielectric layer has been deposited over the structure contact trenches have been formed therein according one embodiment of the present disclosure.

A dielectric layer 402 (e.g., an oxide layer, nitride layer, low-k material or any suitable combination of those materials) is then formed over the entire structure, as shown in FIG. 4. Next, portions of the dielectric layer 402 over the source/drain regions 322, 324, 326, 328 are removed (e.g., through a dry etch such as RIE and/or a wet etch using HF) so as to create contact regions such as trenches/openings 404, 406, 408, 410 exposing at least a portion of the source/drain regions 322, 324, 326, 328.

Figure 5:
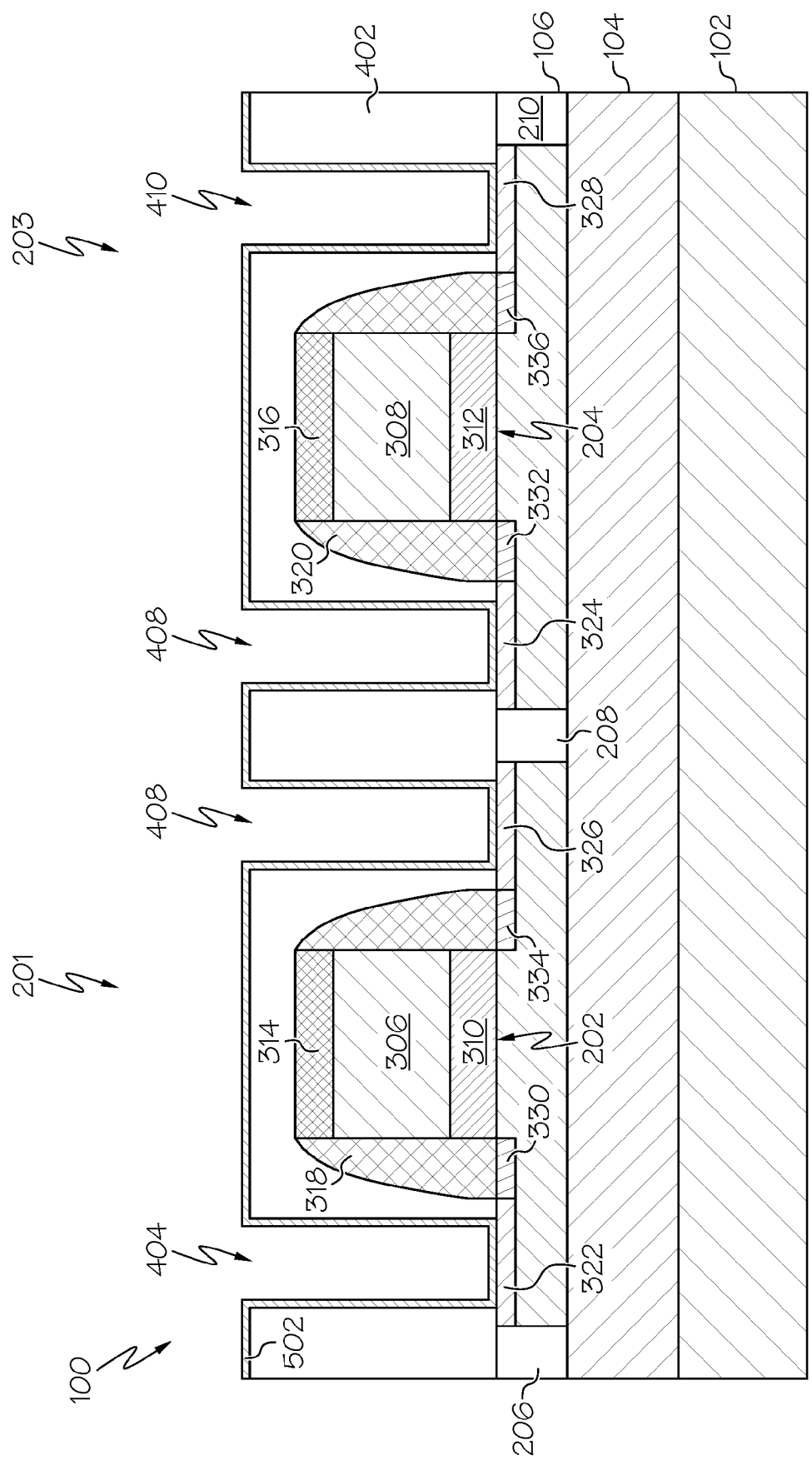
FIG. 5 is a cross-sectional view of the semiconductor structure after a first metal layer has been formed at least within the contact trenches according one embodiment of the present disclosure.
Figure 6:
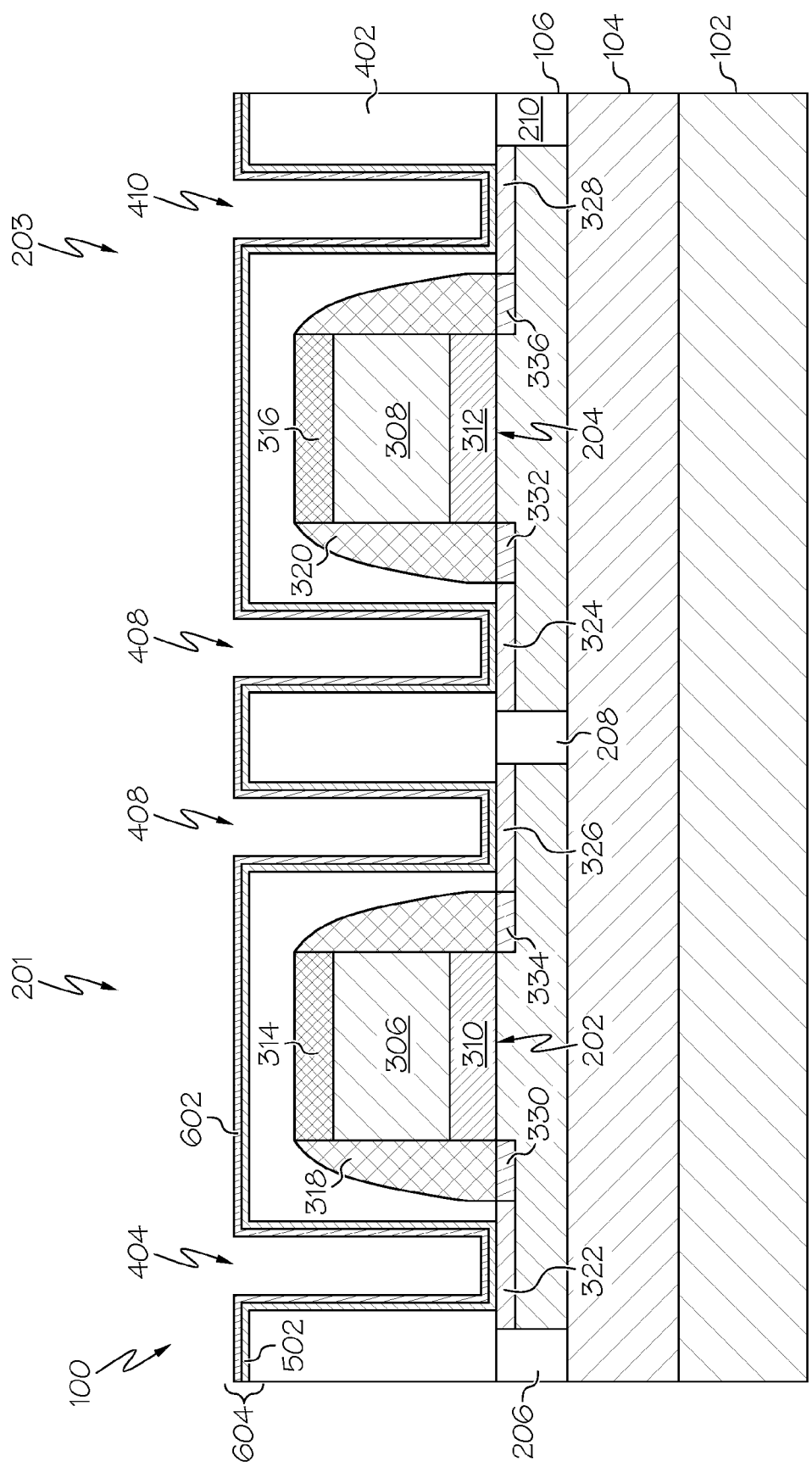
FIG. 6 is a cross-sectional view of the semiconductor structure after a second metal layer has been formed at least within the contact trenches and in contact with the first metal layer according one embodiment of the present disclosure.

A first metal/metallic layer 502 is formed in each of the contact trenches 404, 406, 408, 410 in the n-FET and p-FET regions 201, 203 of the structure 100 by depositing a contact trench metallic material. For example, the first metal layer 502 is formed on the inner sidewalls of the contact trenches 404, 406, 408, 410, a bottom (horizontal) portion of the contact trenches (which is formed on the source/drain regions 322, 324, 326, 328), and a top surface of the dielectric layer, as shown in FIG. 5. A second metal/metallic layer 602 is then formed on the first metal layer 502 creating a metal multi-layer or bi-layer 604. For example, the second metal layer 602 is formed on the inner sidewalls of the first metal layer 502, a bottom (horizontal) portion of the first metal layer 502 (which is formed on the exposed source/drain regions within the trenches), and a top surface of the first metal layer 502, as shown in FIG. 6. The first and second metal layers 502, 602 can be formed by chemical vapor deposition (CVD), physical vapor deposition (PVD), atomic layer deposition (ALD), or any combination thereof.

The first metal layer 502 comprises an n-SBH (Schottky barrier height) metal such as Titanium (Ti), Tungsten (W), Titanium (Ti), TiN, Aluminium (Al), Tantalum (Ta), Ruthenium (Ru), Cobalt (Co), Erbium (Er), Ytterbium (Yb), Yttrium (Y), Dysprosium (Dy), Terbium (Tb) etc. The first metal layer 502 can be formed with a thickness ranging from, for example, 1 nm to 15 nm. The second metal layer 602 comprises a p-SBH (Schottky barrier height) metal such as Platinum (Pt) or nickel-platinum (NiPt), Nickel (Ni), Iridium (IR), Indium (In), Gold (Au), Polonium (Po), Titanium (Ti) etc. The second metal layer 602 can be formed with a thickness ranging from, for example, 1 nm to 15 nm.

In one embodiment, the first metal layer 502 comprises a work function compatible with an n-type contact area, while the first second trench metallic layer comprises a work function compatible with a p-type contact area. Utilizing two different types of metal for two different types of contact areas allows for the selective tuning of the silicide workfunction for an n-FET and p-FET diffusion regions. The first metal layer 502 comprises one or more metal materials (e.g., titanium (Ti)) that form a silicide with a low barrier height (.about.4 eV) for the n-FET device. The second contact trench metallic layer 502 comprises one or more metal materials (e.g., platinum (Pt) or nickel platinum (NiPt) that form high barrier height (.about.5 eV) for the p-FET device. This allows for dual silicide formation on a single wafer.

Figure 7:
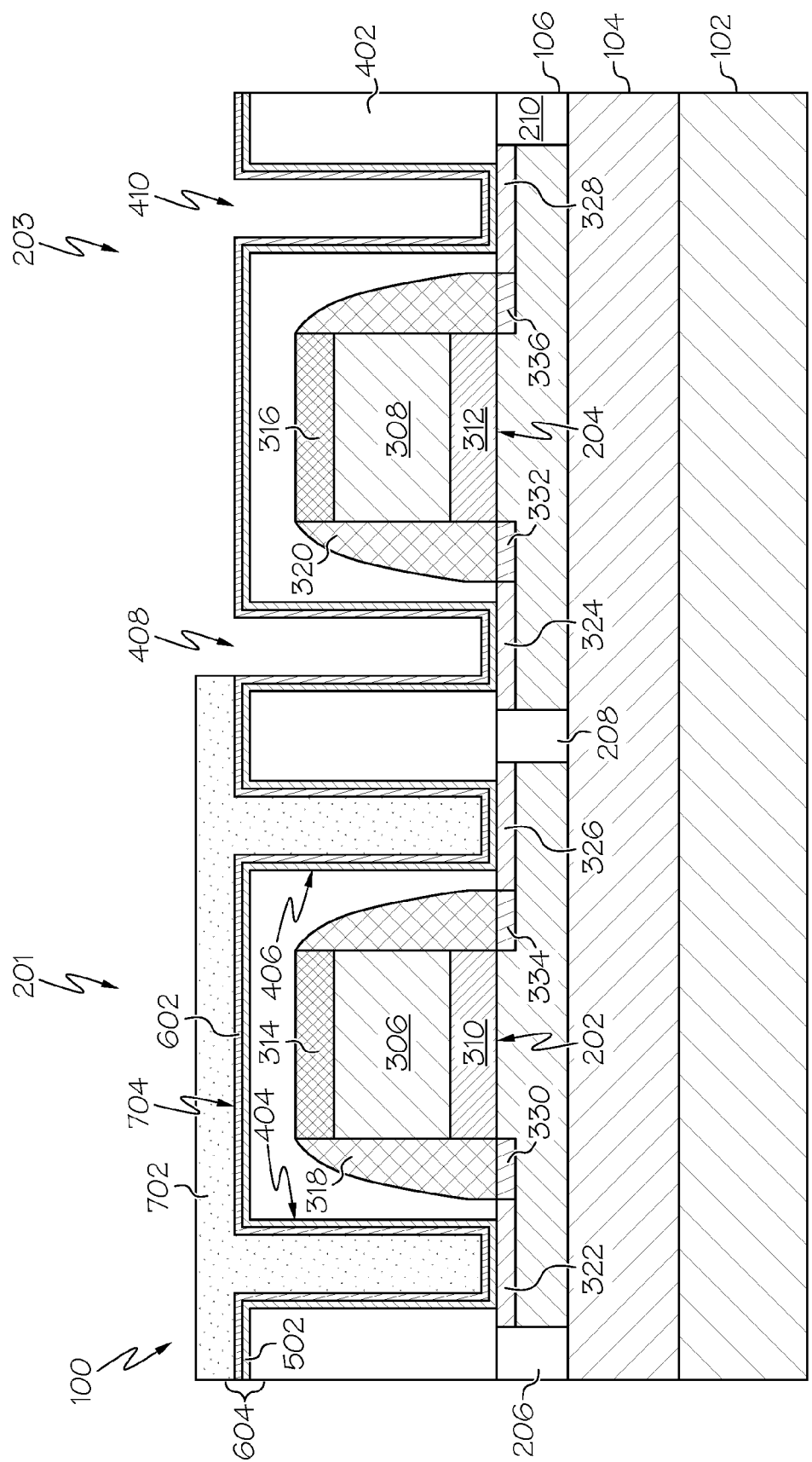
FIG. 7 is a cross-sectional view of the semiconductor structure after the n-FET region has been masked according one embodiment of the present disclosure.

A mask layer 702 is then formed over the n-FET region 201 of the structure 100, as shown in FIG. 7. The mask 702 contacts a top surface 704 of the second metal layer 602 and fills the contact trenches 404, 406 within the n-FET region 201. The mask 702 used during this process can be a hardmask formed from a suitable hardmask material, such as silicon nitride that is deposited onto the wafer and then patterned into the selective hardmask using standard lithography and etching techniques.

Figure 8:
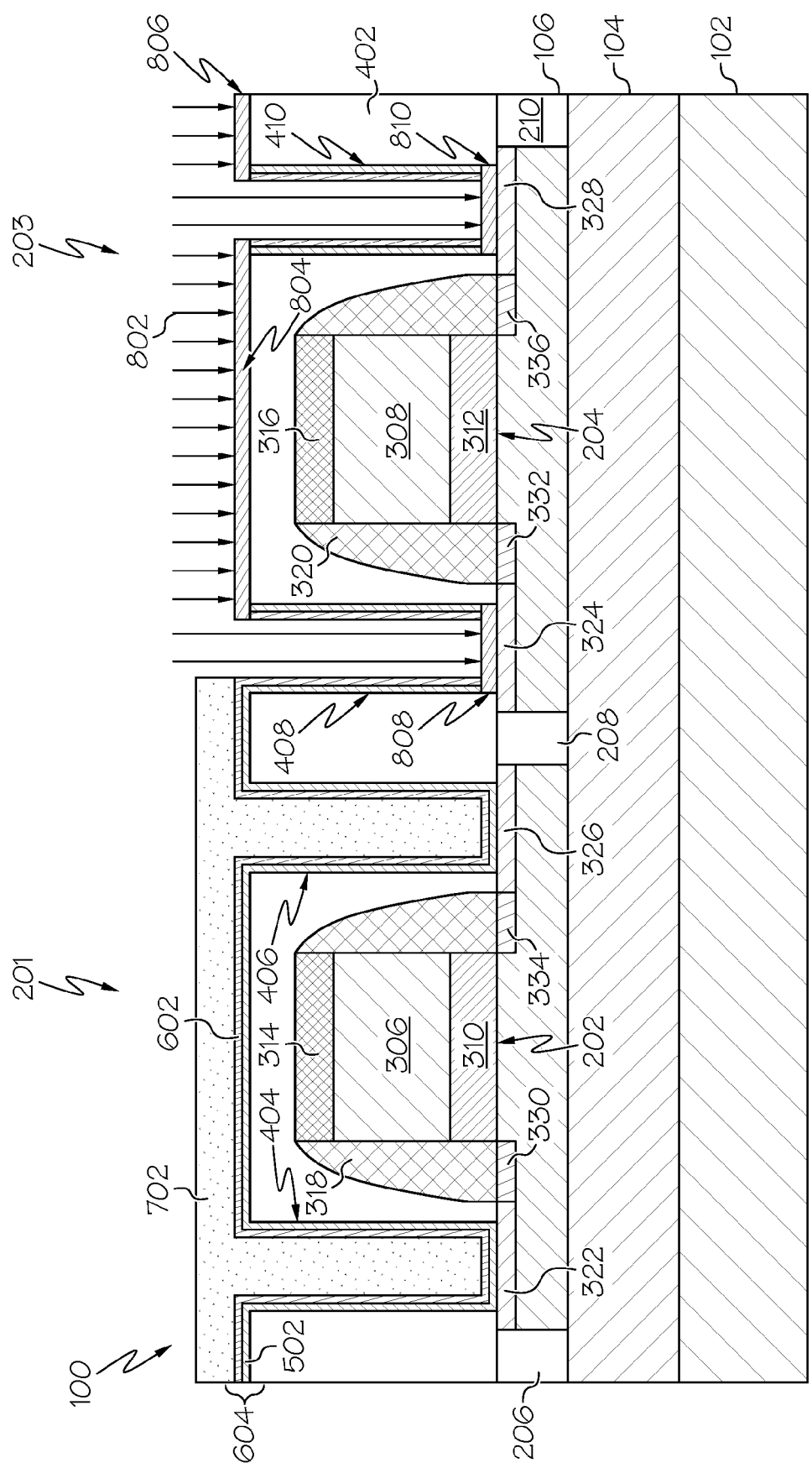
FIG. 8 is a cross-sectional view of the semiconductor structure after an intermixing process has been performed to intermix portions of the first and second metal layers in the p-FET region according one embodiment of the present disclosure.

An ion beam mixing process 802 is then performed within the p-FET region 203 to intermix the metals from the first and second metal layers 502, 602, as shown in FIG. 8. Ion beam mixing refers to the atomic intermixing and alloying occurs at the interface separating two different materials during ion irradiation. Ion beam mixing involves bombarding the first and second metal layers 502, 602 with doses of ion radiation in order to promote mixing at the interface. Ion implantation equipment can be used to achieve ion beam mixing. In one embodiment, ion intermixing is performed with a $1e^{15}$ cm$^2$ to $1e^{17}$ cm$^2$ dose of inert gas implantation (e.g., argon, neon, xenon, etc.). This processes creates an intermixed metal (i.e., Ni-Pt-Ti) 804, 806, 808, 810 (from the first and second metals) at the top surface 812 of the bi-layer 604 and within a bottom region 814, 816 of the p-FET trenches 408, 410 by ballistic ion energy transport. Vertical portions of the bi-layer 604 formed on the at least a portion of the sidewalls of the trenches 408, 410 are not intermixed. In addition, the metals in the bi-layer 604 formed within the n-FET region 201 are prevented from being intermixed by the mask layer 702. Ion beam mixing is further discussed in J.W. Mayer, B.Y. Tsaur, S.S. Laut, L-S. Hung, "Ion-beam-induced reactions in metal-semiconductor and metal-metal thin film structures", Nuclear Instruments and methods, Volumes 182-183, Part 1, 15 Apr.-1 May 1981, Pages 1-13, which is hereby incorporated by reference in its entirety.

Figure 9:
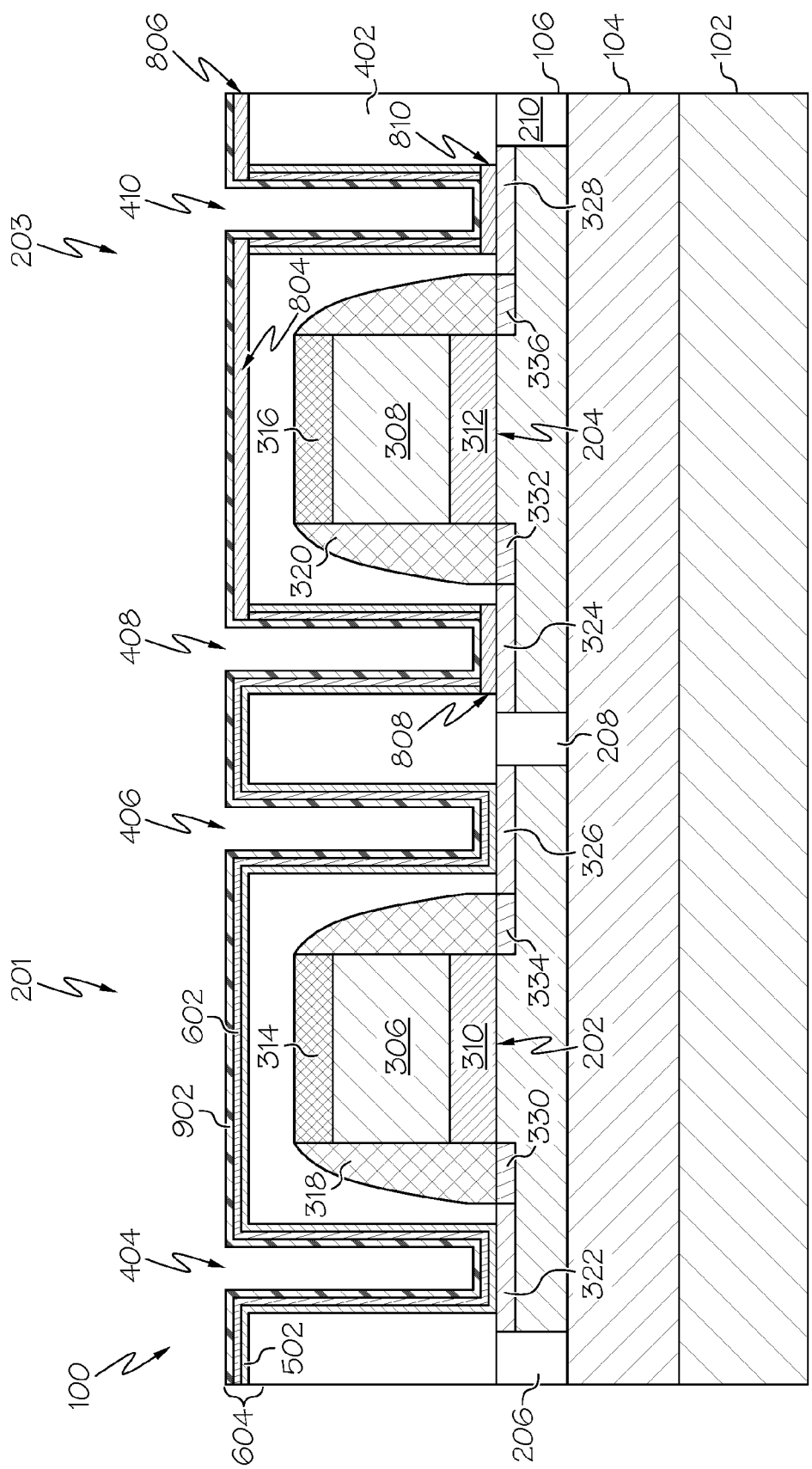
FIG. 9 is a cross-sectional view of the semiconductor structure after the mask has been removed from the n-FET region according one embodiment of the present disclosure.
Figure 10:
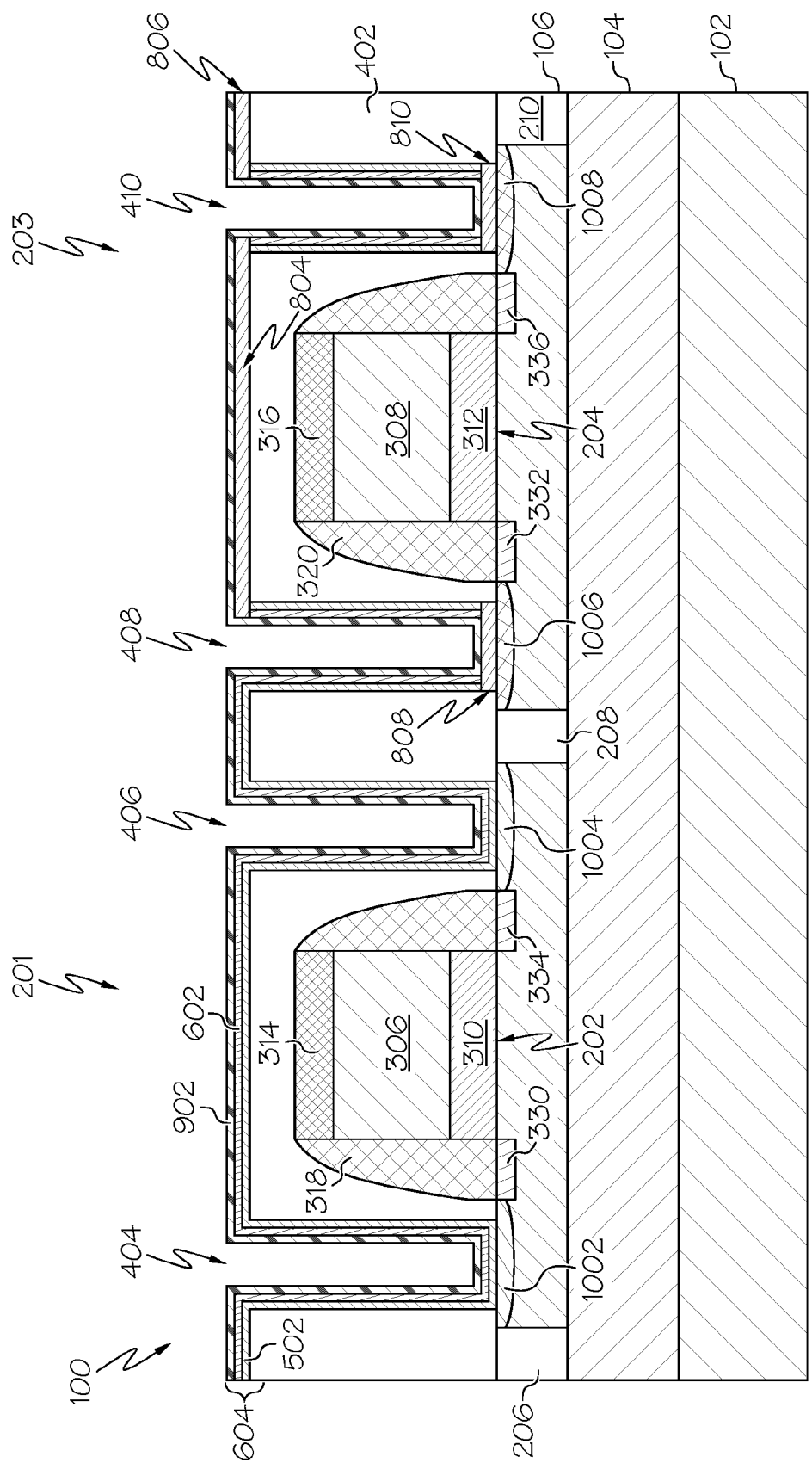
FIG. 10 is a cross-sectional view of the semiconductor structure after a conductive contact liner has been formed at least within the contact trenches according one embodiment of the present disclosure.
Figure 11:
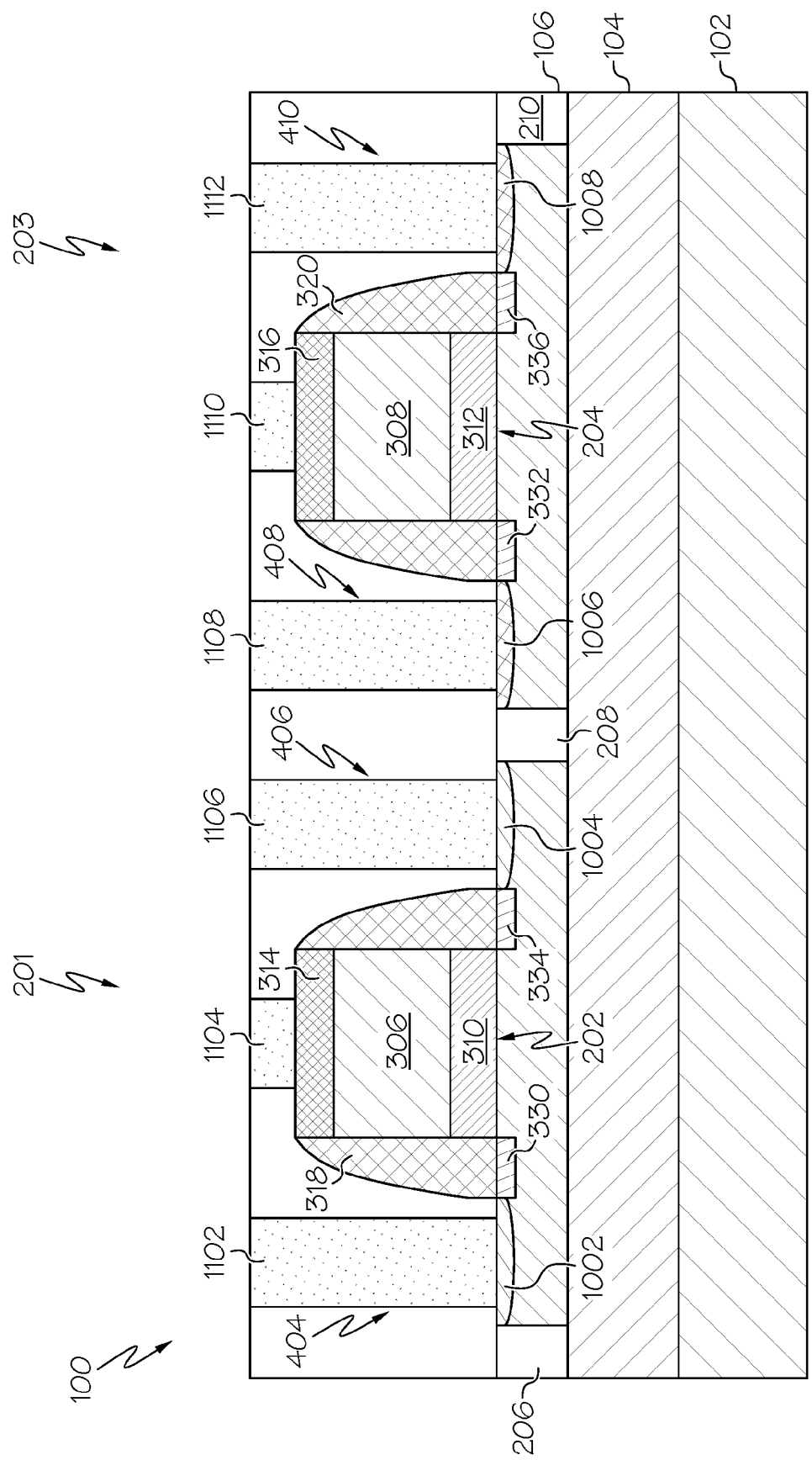
FIG. 11 is a cross-sectional view of the semiconductor structure after a conductive fill layer has been deposited within the contact trenches.

After the ion beam mixing process 802 has been performed, the mask layer 702 is removed from the n-FET area by an etching process. A conductive contact liner 902 (e.g., a titanium nitride liner, tantalum nitride liner, etc.) is formed on the second metal layer 602 and the intermixed metals 804, 806 808, 810 of the bi-layer 604, as shown in FIG. 9. For example, the optional conductive contact liner 902 is formed on the top surface of the second metal layer 602, the top surface of the intermixed metal 804, 806, the inner sidewalls of the second metal layer 602 within the trenches 404, 406, 408, 410, a bottom (horizontal) portion of the second meal layer 602 within the n-FET trenches 404, 406, and a top surface of the intermixed metal 808, 810 formed within the p-FET trenches 408, 410.

An anneal is then performed to form a thin silicide 1002, 1004, 1006, 1008 resulting from the reaction of the bi-layer 604 including the intermixed metals 808, 810 with the semiconductor layer 106. The thickness of the silicide can range from, for example, 1 nm to 15 nm. However, other thicknesses are applicable as well. It should be noted that this anneal can also be performed after the second metal layer 602 has been formed and prior to forming the conductive contact liner 902. The silicide 1002, 1004 formed within the source/drain regions 322, 326 of the n-FET region 201 is an n-SBH silicide such as a Ti-Si silicide. The silicide 1006, 1008 formed within source/drain regions 324, 328 of the p-FET region 203 is a p-SBH silicide such as a Ni-Pt-Ti-Si silicide or Ni-Pt-Ti-Si-Ge silicide resulting from the intermixed n-SBH and p-SBH metals 808, 810 at the lower portion of the trenches 408, 410. The Pt within the bilayer 604 of the p-FET region 203 can segregate into the silicide-source/drain interface to create the p-SBH contact. The anneal can be performed at temperature ranging from, for example, 200° C. to 450° C.

Once the silicide 1002, 1004, 1006, 1008 has been formed, the contact trenches 404, 406, 408, 410 are filled with a lower-k dielectric. A CMP process is performed to remove excess dielectric and unsilicided metal above the trenches. Lithography and etching processes are performed to create contact trenches for the source/drain regions and gates. This process removes any unsilicided metal within the trenches. Contacts 1102 1104, 1106, 1108, 1110, 1112 are then formed by filling the trenches with a conductive fill material layer (e.g., a metal, such as tungsten, copper, aluminum, or any other conventional contact material).

Figure 12:
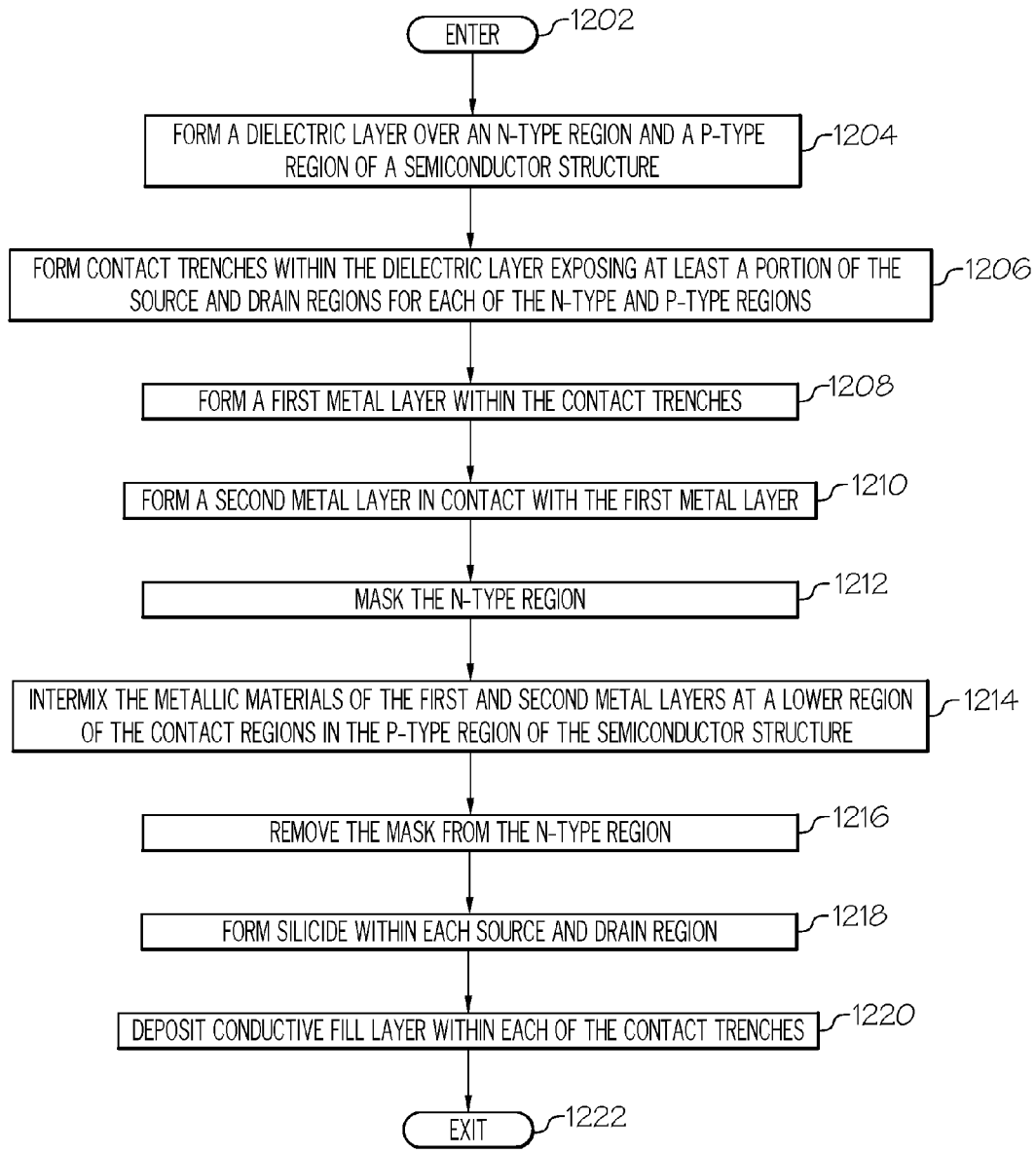
FIG. 12 is an operational flow diagram illustrating one process for forming a semiconductor structure according one embodiment of the present disclosure.

FIG. 12 is an operational flow diagram illustrating a process for forming contact silicide for a semiconductor structure. In FIG. 12, the operational flow diagram begins at step 1202 and flows directly to step 1204. It should be noted that each of the steps shown in FIG. 12 has been discussed in greater detail above with respect to FIGS. 1-11. A dielectric layer, at step 1204, is formed over an n-type region and a p-type region of a semiconductor structure. The semiconductor structure comprises a least a semiconductor layer, a gate stack, and source/drain regions within each of the n-type and p-type regions.

Contact trenches, at step 1206, are formed within the dielectric layer exposing at least a portion of source and drain regions for each of the n-type and p-type regions of the structure. A first metal layer, at step 1208, is formed within the contact trenches. A second metal layer, at step 1210, is formed within the contact trenches and in contact with the first metal layer. The first and second metal layers comprise different metallic/metal materials. The n-type region, at step 1212, is then masked. The metallic materials, at step 1214, of the first and second metal layers within a lower region of the contact trench and at an interface between the first metal layer and the source and drain regions, respectively, at intermixed. Ion beam mixing can be used to intermix the metallic materials.

The mask, at step 1216, is then removed from the n-type region. Silicide, at step 1218, is then formed within each of source and drain region. The silicide within the n-type region is formed from the semiconductor layer and the first metal layer. The silicide within the p-type region is formed from the semiconductor layer and the intermixed portion of the first and second metal layers. A conductive fill layer, at step 1220, is then deposited within each of the contact trenches. This process includes filling the contact trenches with a dielectric; performing a CMP process to remove excess dielectric and unsilicided metal above the trenches; performing lithography and etching processes to remove the dielectric and unsilicided metal within the trenches to expose the silicide and a portion of the gates. The control flow then exits at step 1222.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method of forming contact silicide for a semiconductor structure, the method comprising:
   forming a dielectric layer over a p-type region of a semiconductor structure comprising a gate stack and source and drain regions, the source and drain regions being formed within a semiconductor layer;
   forming a first contact trench and a second contact trench within the dielectric layer exposing at least a portion of the source region and a portion of the drain region, respectively;
   forming a first metal layer within the first and second contact trenches;
   forming a second metal layer in contact with the first metal layer, the second metal layer comprising a metallic material that is different from a metallic material of the first metal layer;
   intermixing the metallic materials of the first and second metal layers in a lower region of the first and second contact trenches, the intermixing forming an intermixed metallic material from the first and second metal layers; and
   forming a silicide within the source and drain regions from the semiconductor layer and the intermixed metallic material.

2. The method of claim 1, wherein the intermixing comprises:
   performing an ion beam mixing process.

3. The method of claim 1, further comprising:
   after the intermixing, forming a conductive contact liner in contact with the second metal layer.

4. The method of claim 3, further comprising:
   depositing a conductive fill material layer within at least the first and second contact trenches.

5. The method of claim 1, further comprising:
   forming a portion of the dielectric layer over an n-type region of the semiconductor structure comprising a gate stack and source and drain regions, the source and drain regions being formed within a semiconductor layer;
   forming at least a third contact trench and a fourth contact trench within the portion of the dielectric layer exposing at least a portion of the source and drain regions, respectively;
   forming the first metal layer within the third and fourth contact trenches;
   forming the second metal layer in contact with the first metal layer within the third and fourth contact trenches; and
   forming a silicide within each of the source and drain regions from the semiconductor layer and the metallic material of the first metal layer, wherein the first metal layer and the second metal layer remain within the third and fourth trenches during formation of the silicide.

6. The method of claim 5, further comprising:
   after forming the first and second metal layers within the first, second, third, and fourth contact trenches and prior to intermixing the metallic materials of the first and second metal layers, forming a mask layer on the dielectric layer formed over the n-type region and within the third and fourth contact trenches.

7. The method of claim 6, further comprising:
   after the intermixing, removing the mask layer, wherein the silicide is formed in the source and drain regions of the n-type and p-type regions of the semiconductor after the mask layer has been removed.

8. A semiconductor structure comprising:
   a substrate;
   a semiconductor layer formed on the substrate;
   a gate stack and source and drain regions formed on a portion of the semiconductor layer in a p-type region of the semiconductor structure;
   a first contact trench and a second contact trench formed over the source and drain regions, respectively; and
   a silicide formed within each of the source and drain regions, the silicide comprising material from the semiconductor layer and an intermixed metal, wherein the intermixed metal comprises a material intermixed from an n-type work function compatible material and a p-type work function compatible material.

9. The semiconductor structure of claim 8, further comprising:
   a conductive contact liner in contact with the silicide formed within each of the source and drain regions; and
   a conductive fill material layer formed on the silicide.

10. The semiconductor structure of claim 8, further comprising:
    a conductive fill material layer formed within each of the first and second contact trenches.

11. The semiconductor structure of claim 8, further comprising:
    a gate stack and source and drain regions formed on a portion of the semiconductor layer in an n-type region of the semiconductor structure;
    a third contact trench and a fourth contact trench formed over the source and drain regions, respectively; and
    a silicide formed within each of the source and drain regions, the silicide comprising material from the semiconductor layer, a metal layer comprising the n-type work function compatible material.

12. The semiconductor structure of claim 11, further comprising:
    a conductive fill material layer formed within the third and fourth contact trenches.

13. An integrated circuit comprising:
    a semiconductor structure, the semiconductor structure comprising
    a substrate;
    a semiconductor layer formed on the substrate;
    a gate stack and source and drain regions formed on a portion of the semiconductor layer in a p-type region of the semiconductor structure;
    a first contact trench and a second contact trench formed over the source and drain regions, respectively and
    a silicide formed within each of the source and drain regions, the silicide comprising material from the semiconductor layer and an intermixed metal, wherein the intermixed metal comprises a material intermixed from an n-type work function compatible material and a p-type work function compatible material.

14. The integrated circuit of claim 13, the semiconductor structure further comprising:
    a conductive fill material layer formed within the first and second contact trenches.

15. The integrated circuit of claim 13, the semiconductor structure further comprising:

a gate stack and source and drain regions formed on a portion of the semiconductor layer in an n-type region of the semiconductor structure;

a third contact trench and a fourth contact trench formed over the source and drain regions, respectively; and a silicide formed within each of the source and drain regions, the silicide comprising material from the semiconductor layer, a metal layer comprising the n-type work function compatible material.

16. The integrated circuit of claim 15, the semiconductor structure further comprising:

a conductive fill material layer formed within the third and fourth contact trenches.

* * * * *